(12) United States Patent
Calvet et al.

(10) Patent No.: US 7,583,006 B2
(45) Date of Patent: Sep. 1, 2009

(54) MEMS DIGITAL LINEAR ACTUATOR

(75) Inventors: Robert J. Calvet, Pasadena, CA (US);
Roman C. Gutierrez, Arcadia, CA
(US); Darrell Harrington, Pasadena,
CA (US); Tony K. Tang, Glendale, CA
(US)

(73) Assignee: Siimpel Corporation, Arcadia, CA (US)

( * ) Notice: Subject to any disclaimer, the term of this patent is extended or adjusted under 35 U.S.C. 154(b) by 439 days.

(21) Appl. No.: 11/190,307

(22) Filed: Jul. 26, 2005

(65) Prior Publication Data

US 2007/0024155 A1    Feb. 1, 2007

(51) Int. Cl.
*H02N 1/00* (2006.01)
(52) U.S. Cl. ..................................... 310/309
(58) Field of Classification Search ................. 310/309
See application file for complete search history.

(56) References Cited

U.S. PATENT DOCUMENTS

| | | | | |
|---|---|---|---|---|
| 4,893,071 A | * | 1/1990 | Miller | 324/660 |
| 5,780,948 A | * | 7/1998 | Lee et al. | 310/81 |
| 5,828,142 A | * | 10/1998 | Simpson | 310/12 |
| 5,896,032 A | * | 4/1999 | Yagi et al. | 324/660 |
| 6,308,573 B1 | * | 10/2001 | Lee et al. | 73/652 |
| 6,424,504 B1 | * | 7/2002 | Abe et al. | 360/294.4 |
| 6,670,738 B2 | * | 12/2003 | Kasahara et al. | 310/309 |
| 6,784,630 B2 | * | 8/2004 | Hartwell | 318/116 |
| 6,785,086 B1 | * | 8/2004 | Bonin et al. | 360/78.05 |
| 6,914,635 B2 | | 7/2005 | Ostergard | |
| 7,142,077 B2 | * | 11/2006 | Baeck et al. | 335/78 |
| 7,211,924 B2 | * | 5/2007 | Furusho et al. | 310/309 |
| 2002/0021055 A1 | * | 2/2002 | Lee et al. | 310/309 |

FOREIGN PATENT DOCUMENTS

JP        63136982 A  *  6/1988

OTHER PUBLICATIONS

Akihiro Koga et al.; "Electrostatic Linear Microactuator Mechanism for Focusing a CCD Camera": Journal of Lightwave Technology, vol. 17, No. 1; pp. 43-47; Jan. 1999.

* cited by examiner

*Primary Examiner*—Burton Mullins
(74) *Attorney, Agent, or Firm*—Haynes & Boone, LLP.

(57) ABSTRACT

In accordance with an embodiment of the present invention, an electrostatic actuator has a base having a plurality of base pillars formed thereon and has a stage having a plurality of stage pillars formed thereon. The controlled application of voltage signals to the base pillars and/or the stage pillars results in electrostatic force that effects movement of the stage with respect to the base.

5 Claims, 4 Drawing Sheets

MEMS DIGITAL LINEAR ACTUATOR

TECHNICAL FIELD

The present invention relates generally to micro electromechanical systems (MEMS) actuators. The present invention relates more particularly to a MEMS digital linear actuator capable producing a comparatively large amount of force and capable of providing a comparatively large amount of movement, such that it is suitable for such applications as moving lenses in the cameras of cellular telephones and the like.

BACKGROUND

Micro electromechanical (MEMS) linear actuators are well known. One example of a contemporary MEMS linear actuator is the linear comb drive. Linear comb drives are electrostatic actuators that have interlaced rows of electrodes. At least one row of electrodes is formed upon a stationary base and at least one row of electrodes is formed upon a movable stage.

Electrostatic charges formed upon the electrodes generate forces that effect movement of a stage with respect to the base. However, this movement is comparatively short and is generally limited to less than the length of the electrodes. Although such comb drives are suitable for some applications, such as moving very small electronic and/or mechanical structures over very small distances, contemporary comb drives do not provide enough force or movement for some other desired applications.

For example, contemporary comb drives are not suitable for moving lenses or lens assembles over distances sufficient to effect focusing and/or zooming of cameras, such as the cameras commonly found in contemporary cellular telephones. Indeed, contemporary camera phones lack adjustable focus and zoom because the contemporary motors used to provide these features are simply too large for use in cellular telephones.

Thus, although such contemporary linear comb drives have proven generally suitable for their intended purposes, they possess inherent deficiencies that detract from their overall effectiveness and desirability. As such, it is desirable to provide a linear actuator that has sufficient force to more a lens or lens assembly and that is capable of sufficient movement so as to be suitable for focusing and/or zooming the camera of a cellular telephone.

BRIEF SUMMARY

According to one aspect of the present invention, a MEMS electrostatic actuator comprises a base having a plurality of pillars formed thereon and a stage having a plurality of pillars. formed thereon. The pillars of the base and the stage are interleaved such that a voltage applied to selected pillars of the base and/or the stage effects the generation of electrostatic forces that cause the stage to move with respect to the base.

In one embodiment, three spatially periodic rows of pillars are formed upon the base and the application of a voltage to selected periodic rows in a cyclic sequence effects desired movement of the stage. The stage can also be maintained in a stable position. In another embodiment, the base pillars and/or the stage pillars are chamfered so as to increase an amount of parallel surface area of the base pillars and the stage pillars, so as to enhance the electrostatic force between the base pillars and the stage pillars.

Sufficient force and distance can be achieved by the present invention so as to make the electrostatic actuator of the present invention suitable for moving a camera lens or lens assembly so as to focus and/or zoom the camera.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION OF THE PREFERRED EMBODIMENTS

Figure 1:
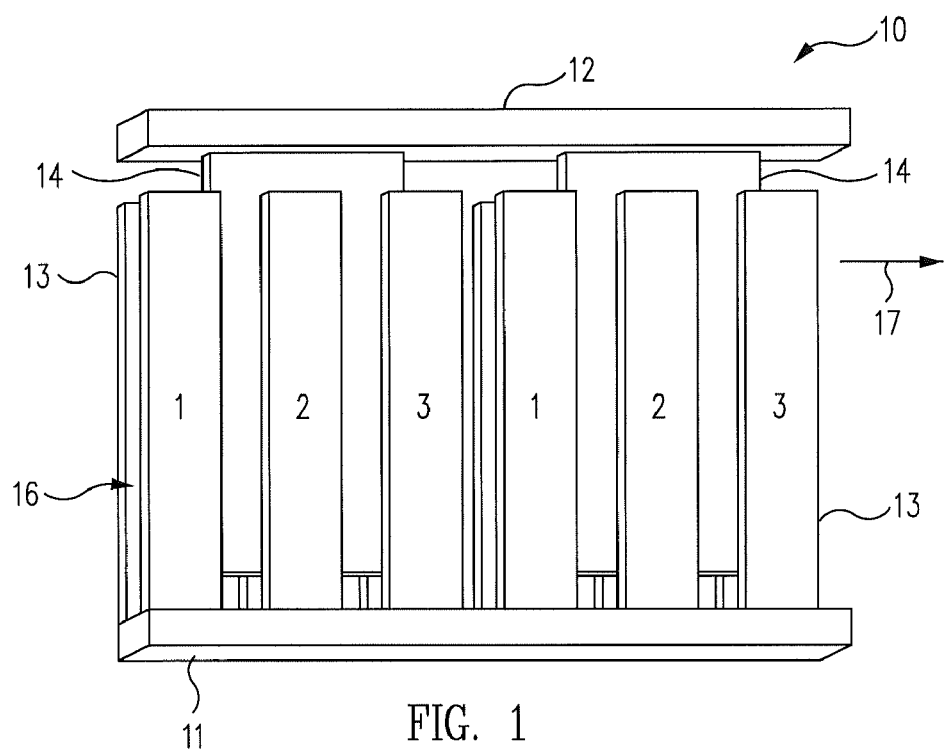
FIG. 1 is a semi-schematic perspective view showing at least a portion of a MEMS digital linear actuator having interlaced base pillars and stage pillars, according to an exemplary embodiment of the present invention.

Referring now to FIG. 1, the digital linear actuator 10 of the present invention generally comprises a stator or base 11 and a moving part or stage 12 that moves generally linearly with respect to base 11. Base 11 has an array of upwardly extending base pillars 13 formed thereon. Stage 12 somewhat similarly has an array of downwardly extending stage pillars 14 formed thereon. Typically, there are fewer stage pillars 14 than base pillars 13 and stage pillars 14 are larger than base pillars 13.

The base pillars 13 can define a two-dimensional array and the stage pillars 14 can also define a two-dimensional array. Both the base pillars 13 and the stage pillars 14 can comprise a conductive material and/or have a conductive material formed thereon. Both the base 11 and the stage 12 can comprise silicon on insulator (SOI) structures. The stage 12 can be fusion bonded to the base 11, such as via restraining structures that facilitate desired movement of the stage 12 with respect to the base 11.

Figure 4:
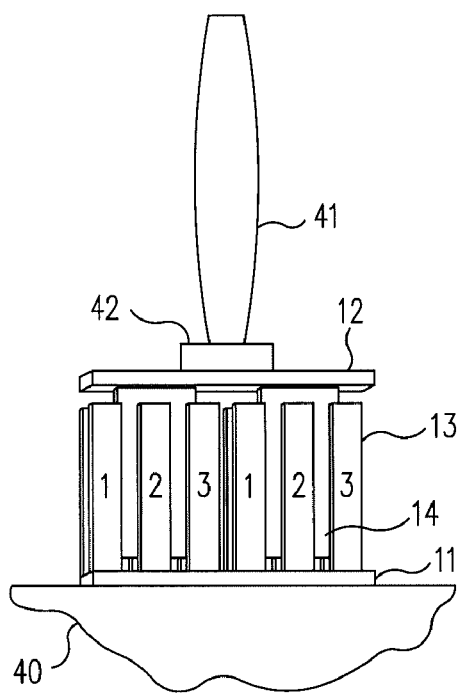
FIG. 4 is a semi-schematic perspective view showing a lens attached to a stage, such as to facilitate focusing and/or zooming of a camera, according to an exemplary embodiment of the present invention.

Base 11 can be attached to a desired structure and stage 12 then used to move a small item in a generally linear fashion with respect to that structure. For example, as shown in FIG. 4 and discussed in detail below, base 11 can be attached to a structure of a camera, such as camera 40 of a cellular telephone, and stage 12 can be used to position a lens or lens assembly 41 for focusing and/or zooming of camera 40.

Base pillars 13 extend substantially in a direction that is perpendicular with respect to base 11 and stage pillars 14 similarly extend substantially in a direction that is perpendicular to stage 12. Thus, a 3-dimensional aspect is added to the electrostatic actuator of the present invention that provides more surface area for the generation of electrostatic forces as compared to contemporary 2-dimensional comb drives. Thus, the use of elongated pillars effects the generation of comparatively greater forces that can be used to move comparatively heavier loads, such as camera lenses.

Base pillars 13 define at least one (as shown in FIG. 1) track 16 therebetween, within which stage pillars 14 are disposed. Track 16 guides stage pillars 14 and defines the motion (such as linear motion) thereof. As discussed below, non-linear tracks can also be provided.

The distance which stage 12 can move is limited by the number of rows of base pillars 13 and thus by the size of base 11. That is, the length of track 16 is determined by the size of base 11. Base 11 can be made large enough to move a lens or lens assembly sufficiently to effect adjustable focusing and/or zooming of a camera.

Indeed, there is no theoretical limit on the size of base 11. Base 11 can theoretically be made arbitrarily long. Further, base 11 does not have to be configured strictly for linear motion. For example, by making the base long enough and/or by curving the tracks defined by the base, a circular track may be formed such that the stage moves about the circular track in the fashion of a racecar about a racetrack. Indeed, tracks can be formed to have a variety of shapes and thus provide a variety of non-linear movements.

According to one aspect of the present invention, a digital electrostatic actuator is provided. Digital operation of the electrostatic actuator is facilitated because the application of discrete electronic control signals can be used to effect desired movement of stage 12 with respect to base 11. That is, stepwise motion along an axis 17 of actuator 10 can achieved, for example, by applying a voltage to spatially periodic sets of rows of base pillars 13 while at the same time grounding all other base pillars 13 and stage pillars 14. In order to achieve linear motion over multiple steps, a cyclic sequence of voltages can be applied to the desired number of spatially periodic base pillars 13. The electrostatic linear actuator of the present invention can further be characterized as being digital in that each position of the stage is a substantially stable equilibrium position and thus closed-loop control of stage position is not required.

As shown in FIG. 1, a three-phase actuator comprises three sets of spatially periodic rows of base pillars 13. Each set of spatially periodic rows defines one phase that corresponds to one set of electrodes. Thus, the rows labeled "1" define a first set of electrodes, the rows labeled "2" define a second set of electrodes, and the rows labeled "3" define a third set of electrodes. That is, base pillars 13 are electrodes and voltages formed thereon generate the electrostatic forces that are used to move stage 12. Voltages can be applied to a selected row via the use of a bus that applies the voltage to all of pillars 13 of the selected row. That is, all of pillars 13 of a given row are in electrical communication with a dedicated bus.

More particularly, the buses can be electrically connected to base pillars 13 such that all of the rows of a given number are simultaneously energized. That is, a given bus electrically interconnects all of base pillars 13 of the rows labeled "1" with one another, another bus electrically interconnects all of base pillars 13 of the rows labeled "2" with one another, and yet another bus electrically interconnects all of the base pillars of the rows labeled "3" with one another. Such electrical interconnection simplifies trace routing and requires the use of only three busses to control movement of stage 12, regardless of the size (i.e., total number of rows) of base 11.

A voltage can be applied to any row or combination of rows of electrodes or base pillars 13, while the remaining electrodes are grounded. As stated above, all of the electrodes within a set can be electrically connected to a common bus to facilitate the simultaneous application of a voltage thereto. The electrodes to which a voltage is applied are referred to as being "on" and the electrodes that are grounded are referred to as being "off". All of the electrodes or pillars 14 of stage 12 are typically grounded during operation of the actuator 10.

Although FIG. 1 shows the use of six rows and two columns of base pillars 16 and the use of two rows and one column of stage pillars 14, such is by way of example only and not by way of limitation. Indeed, any desired number of rows and columns of base pillars and stage pillars can be used.

Figure 2:
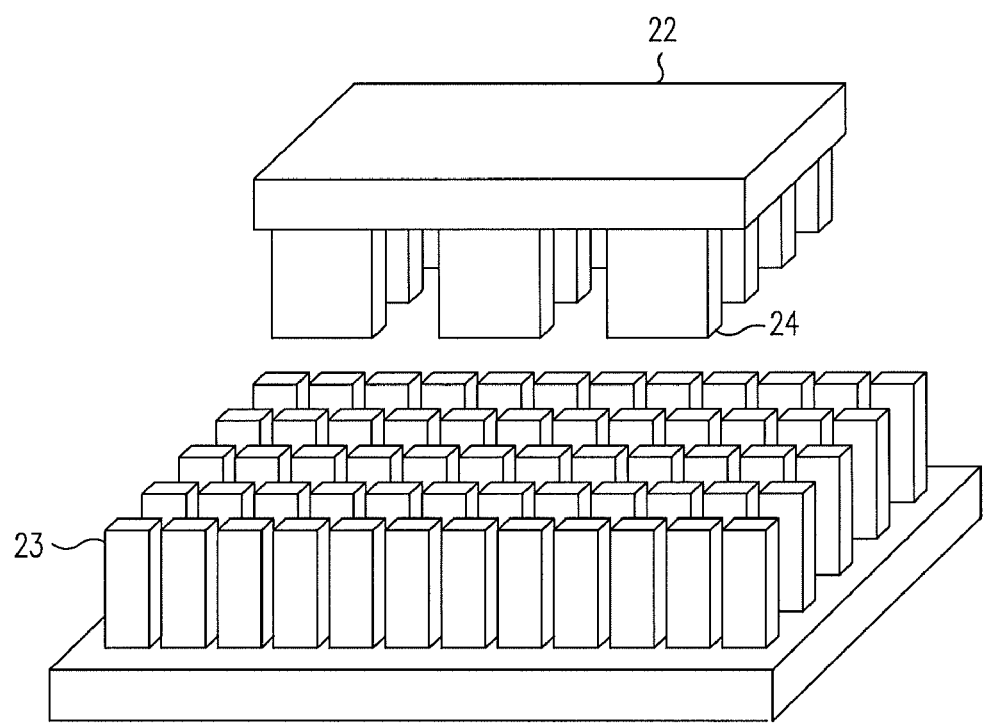
FIG. 2 is a semi-schematic perspective view of at least a portion of a MEMS digital linear actuator having the stage separated from the base, according to an exemplary embodiment of the present invention.

Referring now to FIG. 2, an embodiment of the digital linear actuator of the present invention having a base 21 with twelve rows and five columns of base pillars 23 is shown. This digital linear actuator has a stage 22 with three rows and four columns of stage pillars 24. The use of more rows and columns of base pillars 23 and stage pillars 24 generally increases the stability of stage 22, both when stage 22 is stationary and when it is moving. The use of more rows and columns of base pillars 23 and stage pillars 24 also tends to increase the amount of force that can be generated to more stage 22, thus generally increasing the amount of weight that can be moved.

Figure 3:
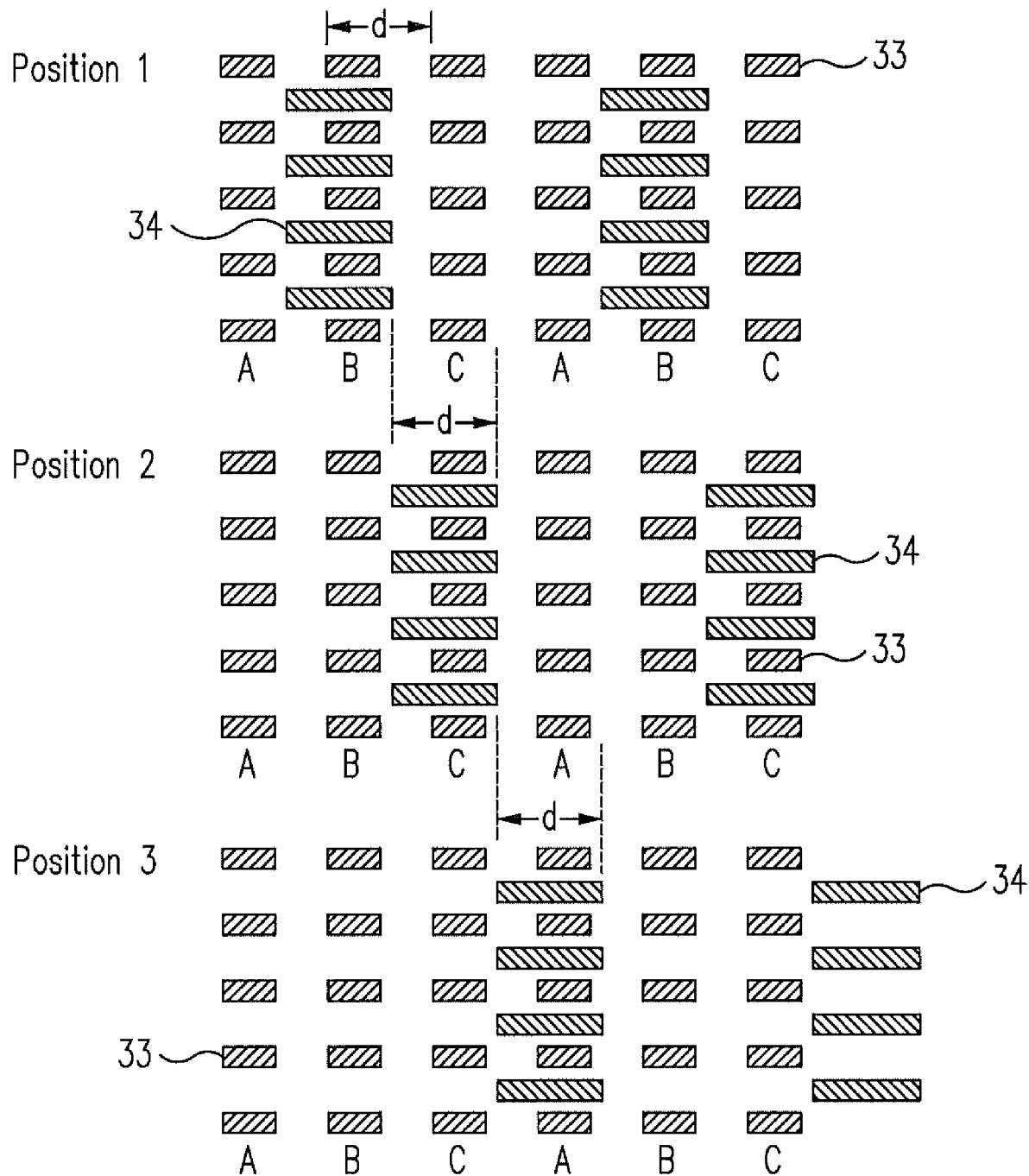
FIG. 3 is a schematic top view showing three different relative positions of stage pillars with respect to base pillars to illustrate operation of a MEMS digital linear actuator, according to an exemplary embodiment of the present invention.

Referring now to FIG. 3, a top view of a linear actuator formed according to one embodiment of the present invention is shown as the stage moves through three consecutive positions thereof, to illustrate operation thereof. The base and stage are omitted for clarity. Base pillars 33 are shown interleaved with stage pillars 34 as they are during operation of the actuator (and as they are shown in the exemplary actuator 10 of FIG. 1). A pitch distance "d" is the distance between adjacent base pillars 33 along the direction of movement of stage pillars 33.

According to this embodiment of the present invention, three independent sets of electrodes or base pillars 33, labeled "A", "B", and "C", are used. When a given set of base pillars 33 is energized or on, then a voltage is, according to this example, applied to all of base pillars 33 corresponding to that label (A, B, or C). For example, when base pillars 33, labeled "A", are on, then the base pillars of both rows labeled "A" have a voltage applied thereto. As mentioned above, all of base pillars 33 within a set can be connected to a common bus to facilitate such operation.

Referring now to the following chart, when a set of base pillars 33 has a voltage applied thereto, the word "on" appears in the column of the chart for that set of base pillars 33 and when a set of base pillars 33 is grounded, the word "off" appears in the column.

| | Electrode (Base Pillar) Status | | |
|---|---|---|---|
| Step Number | Row A | Row B | Row C |
| Sitting at Position 1 | Off | On | Off |
| Moving From Position 1 to Position 2 | Off | On | On |
| Sitting at Position 2 | Off | Off | On |
| Moving From Position 2 to Position 3 | On | Off | On |
| Sitting at Position 3 | On | Off | Off |
| Moving From Position 3 to Position 4 | On | On | Off |

With the stage (and consequently stage pillars 34) initially in position 1 as shown in FIG. 3, the actuation sequence for moving the stage to the right (i.e., to positions 2 and 3), is shown in the table above. This table shows movement over three steps. However, it is important to appreciate that the cycle can be repeated so as to facilitate movement over a total range that is limited by the size of the array of base pillars. Further, the number of steps in a cycle can be a number other than three.

Such movement of the stage over a total range that is limited by the size of the array of base pillars is facilitated by the lack of a need for a restoring force. Since no restoring force is required, movement of the stage is not limited by a mechanism for providing a restoring force.

However, a restoring force can optionally be used. In such instances, the force of the actuator opposes a restoring force. For example, the restoring force can be applied by restrains or biasing elements for the stage. These restrains or biasing elements help define the desired path and range of motion for the stage and can comprise springs, magnets, electromagnets, flexures, cushions, stops, and a variety of other structures.

At each step, one set of electrodes provides a force that holds the stage in place against the restoring force. The equilibrium position of the stage is the location where the electrostatic holding force is equal to the restoring force. When different electrodes are energized or de-energized, the stage moves so as to establish a new equilibrium position. In order to move the stage one increment or step, a second set of electrodes is turned on. The stage then moves until a new equilibrium is established.

In the initial position 1, stage pillars 34 are approximately aligned with the "B" row of base pillars. In position 1, the row A electrode is off, the row B electrode is on, and the row C electrode is off, as shown in the chart above. This is a generally stable, equilibrium position of the stage.

To move the stage from position 1 to position 2, the row A electrode remains off, the row B electrode remains on, and the row C electrode is turned on. Once the stage is at position 2, then the row B electrode can be turned off and the row C electrode remains on. Moving from position 2 to position 3 and so on occurs in a similar fashion, with the electrode for the next row being energized while keeping the electrode for the present row energized and then turning the electrode for the present row off after the move has, at least partially, occurred. This sequence of electrode energizing is given in the chart above.

Referring now to FIG. 4, a lens 41 can be attached to stage 12 of FIG. 1, such as via a lens mount 42. Base 11 can be attached to a camera 40, such as a camera of a camera phone. Thus, movement of stage 12 can effect focusing and/or zooming of the camera 40.

Figure 5:
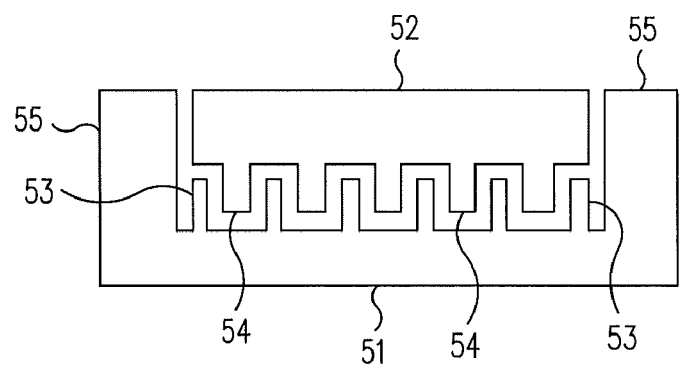
FIG. 5 is a semi-schematic end view of a MEMS digital linear actuator, showing the base pillars and the stage pillars being interleaved with one another, according to an exemplary embodiment of the present invention.

Referring now to FIG. 5, an end view of an exemplary electrostatic actuator formed according to one aspect of the present invention is shown, wherein a stage is configured to move in and out of the plane of the drawings. The actuator comprises a base 51, a stage 52 that is moveable with respect to base 51, a plurality of upstanding base pillars 53 formed upon base 51, and a plurality of downwardly extending stage pillars 54 formed upon stage 52. Restraining sidewalls 55 inhibit undesirable rotation and/or lateral translation of stage 52.

The amount of force provided by the present invention is determined by the number of rows of base and stage pillars. The amount of distance that the stage can travel is determined by the number of rows of base pillars.

Figure 6:
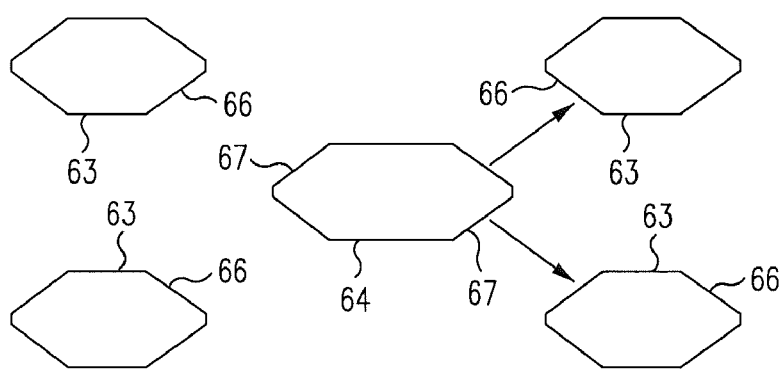
FIG. 6 is a semi-schematic top view showing four base pillars and one stage pillar, each having four chamfers formed thereon, according to an exemplary embodiment of the present invention.

Referring now to FIG. 6, base pillars 63 and/or stage pillars 64 can optionally be formed to have base pillar chamfers 66 and/or stage pillar chamfers 67, respectively, formed thereon. The base pillar chamfers 66 and stage pillar chamfers 67 increase the amount of parallel surface area between base pillars 63 and stage pillars 64, so as to increase the amount of electrostatic force therebetween, at least during a portion of the movement of the stage. Thus, when a voltage is applied to a selected row of base pillars 63, base pillar chamfers 66 and stage pillar chamfers 67 act somewhat like the plates of parallel plate capacitors, thereby providing a force that is roughly proportional to the inverse square of the distance therebetween.

This is in contrast to the contribution of electrostatic force provided by the faces of base pillars 63 and stage pillars 64, which are generally parallel to the axis of motion of the stage (i.e., the non-chamfered faces). These faces act more like a comb drive and provide a force along the axis of motion that is proportional to the inverse of the distance therebetween.

By orienting the parallel faces of chamfers 66 of base pillars 63 and chamfers 67 of stage pillars 64 such that they are approximately parallel when the stage is in a non-moving equilibrium or rest position, stability of that rest position is enhanced. Alternatively, the parallel faces of chamfers 66 and 67 can be oriented to achieve other desired results, such as increased force during the start of motion so as to better overcome inertia and/or any static frictional forces.

Optionally, more that one set of chamfers can be formed upon base pillars 63 and/or stage pillars 63, so as to enhance more than one characteristic of the electrostatic actuator. For example, one set of chamfers could be formed to enhance rest position stability and another set of chamfers could be formed to better overcome inertia. Chamfers having more than one orientation can be formed upon a single pillar. For example, two or more chamfers, either on the same corner or on different corners of a pillar, can be formed upon the same pillar.

Chamfers having more than one orientation can be formed upon separate pillars. Thus, one pillar can have one or more chamfers formed thereon to provide rest position stability, while another pillar has one or more chamfers formed thereon to mitigate inertia.

Instead of a flat chamfer, a curved chamfer may be used so as to tend to optimize the electrostatic force between base pillars and stage pillars along some portion or all of the range of travel. Thus, one portion of the curve tends to enhance electrostatic force during the initialization of movement of the stage, while another portion of the curve tends to enhance electrostatic force during a later portion of movement. Yet another portion of the curve can enhance electrostatic force when the stage is stationary.

The electrostatic linear actuator of the present invention is capable of producing larger forces, and thus is capable of moving heavier loads, than contemporary comb actuators because of the increased surface area provided by the use of pillars and/or because of the use of chamfered surfaces formed thereon. Extension of the force generating surfaces into the vertical dimension facilitates the generation of greater electrostatic forces without undesirably increasing the footprint of the stage. That is, the force per unit area of the stage is high as compared to contemporary electrostatic actuators. Further, the electrostatic actuator of the present invention is capable of a long throw. The interleaved base pillars and stage pillars enable the moving stage to have a wide range of motion that is dependent upon the size of the array of base pillars and not upon the force generated in each step of stage motion.

No mechanical contact between the base and the stage is required. The stage can be held in position relative to the base via the use of restraining structures, such as springs or flexures. Thus, static friction, capillary adhesion, and wear are mitigated.

Since the electrostatic actuator of FIGS. 1-6 is digital in operation, closed loop control is not required. This is because the stage moves to a known position in response to the application of digital control signals and is substantially stable in that position.

Figure 7:
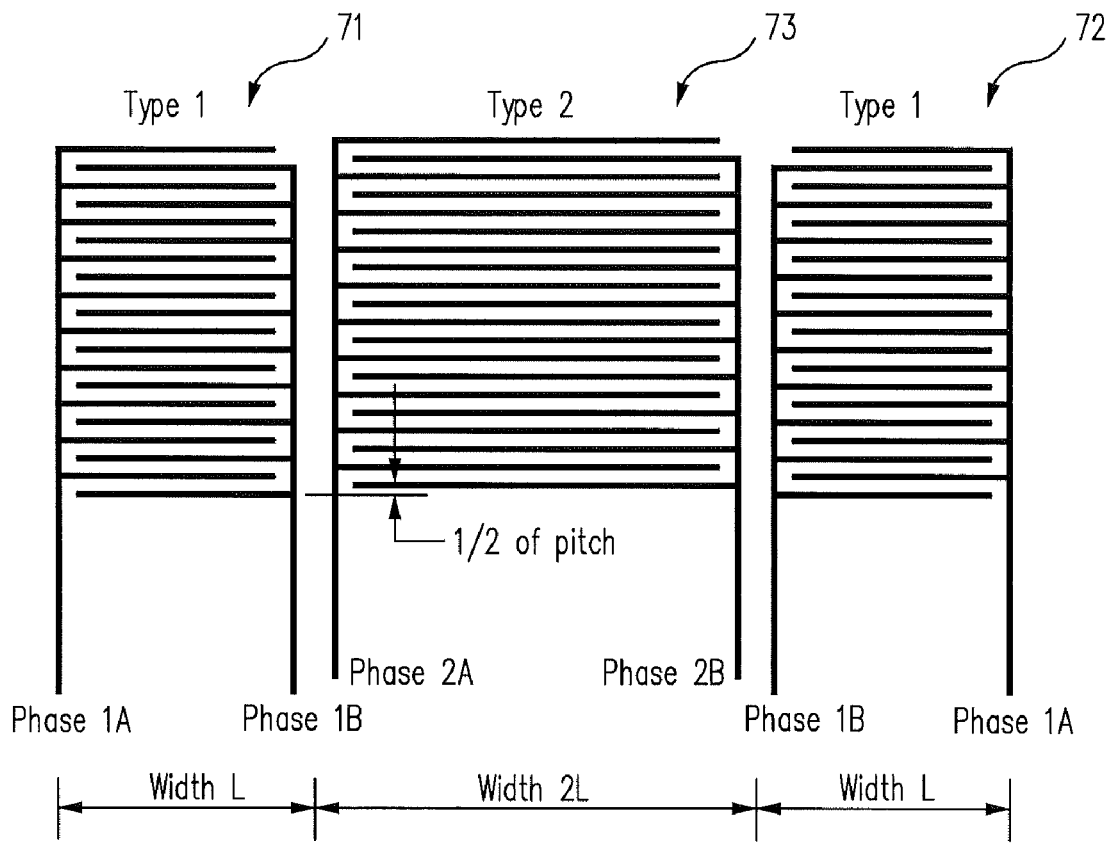
FIG. 7 is a semi-schematic drawing showing an exemplary layout of electrodes, according to an exemplary embodiment of the present invention.
Figure 8:
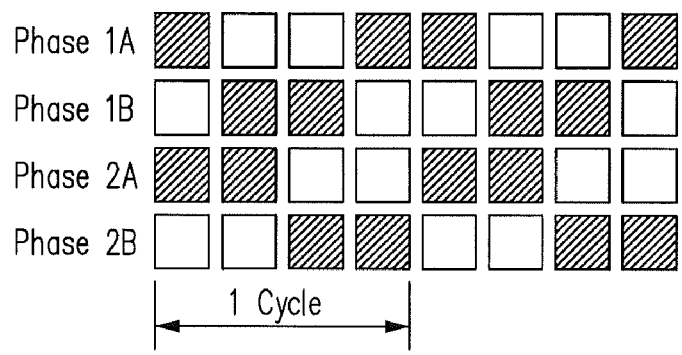
FIG. 8 is a semi-schematic diagram showing an exemplary actuation sequence for the electrodes of FIG. 7.

Referring now to FIGS. 7 and 8, a flat plate linear actuator with easy trace routability and no direction ambiguity is shown. Linear actuators, including the MEMS digital linear actuator described above, typically use a minimum of three phases to prevent ambiguity in drive direction. In this manner, the electrostatic force applying structures, such as the pillars in the linear actuator described above, are configured such that when a voltage is applied to one set (row) thereof (such as the set immediately in front of the moving piece), the force provided from the same set at a different location (such as behind the moving piece) is very weak compared to the force provided from the set closer to the moving piece, thus preventing ambiguity in drive direction. That is, only one set of electrostatic force applying structures for any given phase ever applies enough force to effect movement of the moving piece.

However, it is difficult to route and connect three phases of electrodes using the standard 2-dimensional lithographic techniques that are sometimes preferred in the fabrication of electrostatic actuators. Thus, it is sometimes desirable to use only two phases of electrodes.

According to one aspect of the present invention, an electrostatic actuator is provided wherein ambiguity of direction is prevented and the use of 2-dimensional lithographic techniques is facilitated. This embodiment of the present invention uses two different sets of two-phase electrodes, side-by-side, to provide four different effective phases. The four different effective phases eliminate direction ambiguity. Since there are only two sets of electrodes, the use of 2-dimensional lithographic techniques is facilitated. Thus, the conductive conduits or traces are comparatively easy to route.

With particular reference to FIG. 7, two types of electrode assemblies are used for the base or stator. A leftmost electrode assembly 71 and a rightmost electrode assembly 72 are referred to as type 1 and can be mirror images of one another. A middle electrode assembly 73 is referred to as type 2. Type 1 electrode assemblies 71 and 72 are half as wide as type 2 electrode assembly 73. Both type 1 electrode assemblies are offset by one half pitch with respect to type 2 electrode assembly 73.

By providing two type 1 electrode assemblies 71 and 72, each with a width that is one half that of the single type 2, and by placing the two type 1 electrode assemblies to the left and right of the single type 1 electrode assembly, left to right symmetry is maintained and the drive force remains symmetrical and tends to be optimized.

Offsetting the type 1 and type 2 electrode assemblies with respect to one another facilitates the use of four effective phases, while maintaining the need to route traces for only two phases. A first phase is provided by energizing the leads labeled Phase 1A, a second phase is provided by energizing the leads labeled Phase 1B, a third phase is provided by energizing the leads labeled Phase 2A, and a fourth phase is provided by energizing the leads labeled Phase 2B.

The electrodes on the moving piece or translator (not shown) can be parallel linear strips having a width of approximately 4L, such that they extend substantially across both type 1, 71 and 72, electrode assemblies, as well as type 2 electrode assembly 73, simultaneously. That is, the translator can be wide enough to cover all of the electrodes. The pitch of the translator electrodes can be twice the pitch of the drive or stator electrodes.

All of the electrode assemblies of the electrostatic actuator of FIGS. 7 and 8 can be formed by patterning metal upon glass or silicon via photolithographic techniques. The electrodes can also be formed upon 3-dimensional structures, such as those of semi-conducting silicon formed upon a buried oxide layer. Although this embodiment of the present invention enhances the operation of flat plate electrostatic actuators, it may also be used for 3-dimensional electrostatic actuators, such as those of FIGS. 1-6.

With particular reference to FIG. 8, an exemplary actuation sequence for the electrode assemblies of FIG. 7 is provided. According to this actuation sequence, one cycle of movement is achieved by first energizing phase 1A and phase 2A; then energizing phase 1B and phase 2A; then energizing phase 1B and phase 2B; and finally by energizing phase 1A and phase 2B. This cycle may be repeated as necessary to achieve the desired motion.

The application of voltages to base electrodes or base pillars is discussed herein. However, voltages may alternatively be applied to stage electrodes or pillars. Indeed, in some instances the distinction between the base and the stage may become less important or even non-existent. Thus, voltages may be applied to any desired combination of base electrodes and/or stage electrodes.

The present invention may be used to move a variety of items for a variety of different applications. One exemplary application is the focusing and/or zooming of small cameras, such as those used in camera phones, web cams, personal digital assistants (PDAs), and the like. However, discussion of the use of the present invention in this application is by way of example only, and not by way of limitation.

Although attractive electrostatic forces are used in the exemplary embodiments discussed herein, repelling electrostatic forces or a combination of attractive and repelling electrostatic forces may alternatively be used. Thus, attractive electrostatic forces may be generated between some pairs of electrodes, while repelling electrostatic forces are simultaneously generated between other pairs of electrodes.

One method of generating such electrostatic repulsion is when there is an image charge generated in a pair of electrodes of the actuator. One electrode (such as an electrode defined by a base pillar) of the actuator can be formed of a conductor and the other electrode (such as an electrode defined by a stage pillar) can be formed of an insulator.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. An electrostatic actuator, comprising:

a base having a two-dimensional array of discrete base pillars upstanding therefrom; and, a stage having a two-dimensional array of discrete stage pillars extending downward therefrom, wherein respective rows of the arrays of upstanding base pillars and downward extending stage pillars are interleaved between each other in an alternating arrangement that enables respective rows of the stage pillars to move in a row direction between adjacent rows of the base pillars and the stage to move relative to the base through a distance greater than at least twice the width of any one of the base or stage pillars in the row direction, and an electrostatic force acting between the stage pillars and the base pillars effects linear, parallel movement of the stage with respect to the base.

2. The electrostatic actuator as recited in claim 1, wherein the base pillars and the stage pillars are each formed of electrically conductive material.

3. The electrostatic actuator as recited in claim 1, wherein the actuator is responsive to the application of digital signals.

4. The electrostatic actuator as recited in claim 1, wherein at least one of the base pillars and the stage pillars have chamfers lying in a plane of the respective pillars formed thereon.

5. The electrostatic actuator as recited in claim 1, wherein the electrostatic force is attractive.

* * * * *